(12) United States Patent
Zundel et al.

(10) Patent No.: US 7,612,408 B2
(45) Date of Patent: Nov. 3, 2009

(54) MOS TRANSISTOR DEVICE

(75) Inventors: Markus Zundel, Egmating (DE); Rudolf Zelsacher, Klagenfurt (AT); Hermann Peri, Wernberg (AT); Dietmar Kotz, Moosburg (AT)

(73) Assignee: Infineon Technologies AG, Munich (DE)

( * ) Notice: Subject to any disclaimer, the term of this patent is extended or adjusted under 35 U.S.C. 154(b) by 103 days.

(21) Appl. No.: 10/996,849

(22) Filed: Nov. 24, 2004

(65) Prior Publication Data
US 2005/0116267 A1 Jun. 2, 2005

(30) Foreign Application Priority Data
Nov. 28, 2003 (DE) .................. 103 55 588

(51) Int. Cl.
*H01L 29/94* (2006.01)
(52) U.S. Cl. .................. 257/333; 257/E29.26
(58) Field of Classification Search ......... 257/328–330, 257/333, E29.26
See application file for complete search history.

(56) References Cited
U.S. PATENT DOCUMENTS
6,285,060 B1  9/2001  Korec et al.
6,462,376 B1  10/2002  Wahl et al.
2001/0023961 A1*  9/2001  Hshieh et al. ............... 257/330
2003/0020134 A1  1/2003  Werner et al.
2003/0173618 A1  9/2003  Zundel et al.

FOREIGN PATENT DOCUMENTS
EP  1 168 455  6/2001

* cited by examiner

*Primary Examiner*—Bradley K Smith
*Assistant Examiner*—Amar Movva
(74) *Attorney, Agent, or Firm*—Dicke, Billig & Czaja, PLLC (57) ABSTRACT

The invention relates to a MOS transistor device of the trench type, in which, in a semiconductor region of a first conductivity type, within a deep gate trench extending in the vertical direction of the semiconductor region, a vertical gate electrode and a gate oxide with a field plate step insulating the latter are formed and, in an adjoining mesa region outside and laterally with respect to the deep trench, at the upper section thereof, a source electrode region of the first conductivity type and a body region of a second conductivity type with one or a plurality of assigned body contact are formed, a drain electrode region of the first conductivity type lying opposite the deep trench in the vertical direction. The MOS transistor has a deep body reinforcement of the second conductivity type below the body region at the location of the body contact, said body reinforcement lying deeper than the field plate step.

16 Claims, 8 Drawing Sheets

Prior Art

——— p-n Junctions
– – – – Boundaries of the Space Charge Zones

——— p-n Junctions
– – – – Boundaries of the Space Charge Zones

MOS TRANSISTOR DEVICE

CROSS-REFERENCE TO RELATED APPLICATIONS

This Utility Patent Application claims priority to German Patent Application No. DE 103 55 588.9 filed on Nov. 28, 2003, which is incorporated herein by reference.

FIELD OF THE INVENTION

The invention relates to a MOS transistor device.

BACKGROUND

Figure 2:
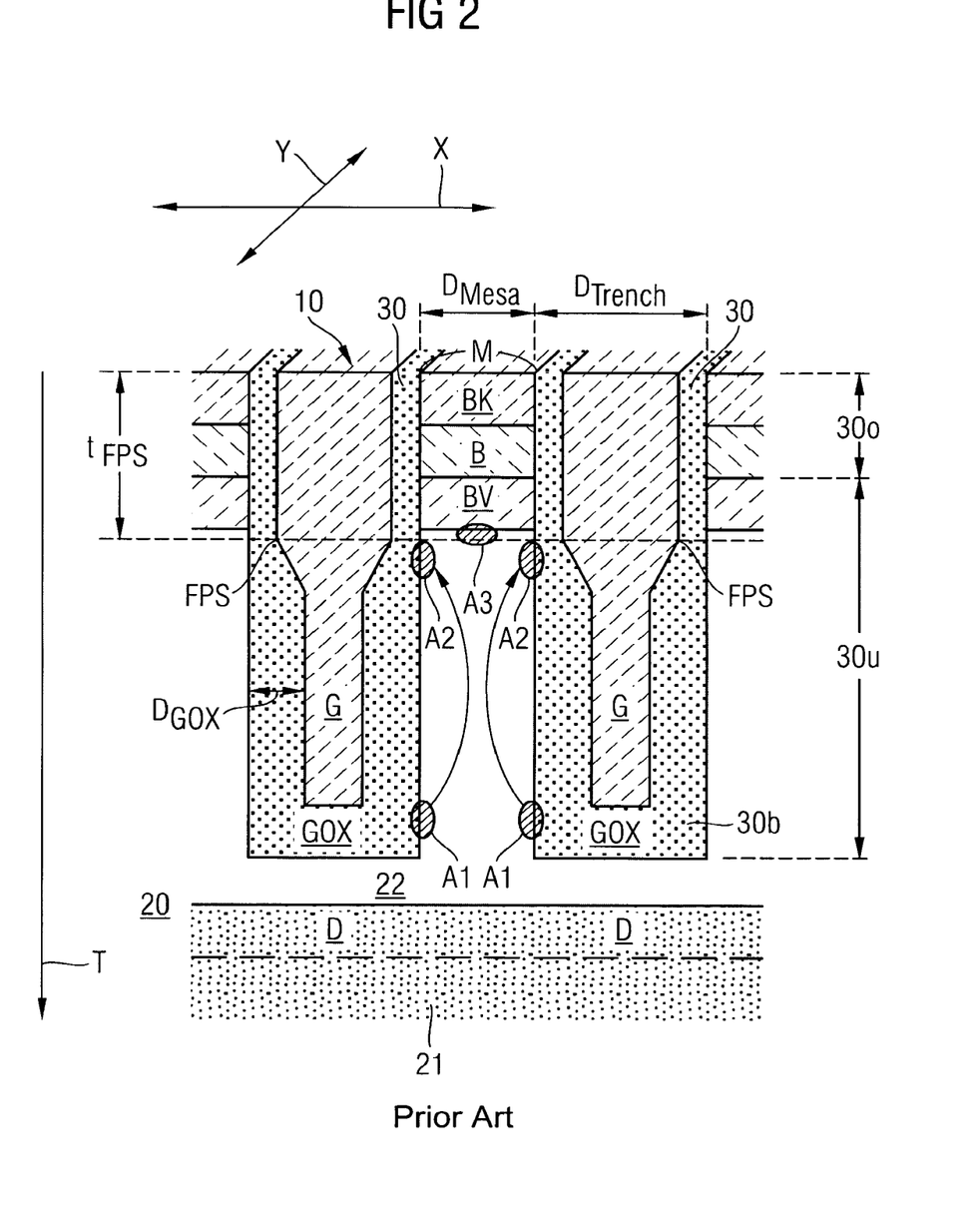
FIG. 2 illustrates a known MOS transistor device in the form of a schematic lateral cross section.

The accompanying FIG. 2 shows a lateral cross-sectional view of a trench transistor device 10, which is configured as a DMOS transistor and has two MOS trench transistor cells in the example illustrated. A MOS transistor device of this type is the subject matter of DE 102 07 309 A1 from Infineon Technologies AG. The MOS transistor device illustrated is formed in a semiconductor region 20, in a substrate region 21 and an epitaxial region 22 of the first conductivity type, which may be the n type by way of example, and has alternately in each case a mesa region M having the width $D_{Mesa}$ adjoining a deep gate trench 30 having the width $D_{Trench}$. A multiplicity of MOS transistor cells of this type may be formed in the lateral direction that proceeds toward the right and left and is indicated by the double arrow X in FIG. 2. The wall regions of the gate trenches 30 are lined with a gate oxide GOX, for example made of silicon oxide, that serves as an insulation region. The gate oxide GOX has a maximum thickness $D_{GOX}$ in a lower region 30u of the gate trench 30. The gate oxide GOX is very much narrower in the upper region 30o of the gate trench 30. A gate electrode G projects into the deep trench 30 in a manner encapsulated in insulating fashion by the gate oxide GOX, said gate electrode being insulated toward the outside by the gate oxide GOX. By virtue of the aforementioned thinning of the gate oxide GOX toward the upper region 30o of the gate trench 30, the gate electrode G has a so-called field plate structure in such a way that the gate oxide GOX is thickened from the upper region 30o of the gate trench 30 via a field plate step FPS to the lower section 30o of the gate trench 30. In the topmost section of the mesa region (M) a source electrode region (S) is formed with a doping corresponding to the first conductivity type (in this case n$^+$ by way of example). A body region B of a second conductivity type (for example p) lies directly below the source electrode S. A body reinforcement BV is situated at the location of the body contact.

FIG. 2 makes it clear that the bottom of the body reinforcement BV, that is to say the lower boundary thereof, is situated above the field plate step FPS, that is to say that the depth of the body reinforcement BV measured in the direction of the arrow T is less than the depth $t_{FPS}$ of the field plate step FPS likewise specified in the direction of the arrow T.

A drain electrode D lying opposite the deep trench 30 is situated in the substrate region 21 highly doped with the first conductivity type. Small local zones $A_1$, $A_2$, $A_3$ indicated in hatched fashion specify the probable locations of the avalanche breakdown, which normally lie at the locations A1 in the base region 30b of the gate trench 30 but in the high-current case abruptly move upward to the locations specified by A2 and A3. That is to say that if the current density in the avalanche case reaches high values at which the background doping of the epitaxial layer 22 in the mesa M is appreciably influenced, the electric field distribution changes in such a way that the breakdown location in the mesa M jumps upward either to the locations A2 beside the field plate step FPS or to the location A3 at the bottom of the body reinforcement BV or to the body B itself if no body reinforcement BV is present. The jump of the breakdown location to the field plate step FPS (locations $A_2$) is disadvantageous for a number of reasons: situated directly in the region of the field plate step FPS is the gate oxide GOX, which can be damaged by the hot charge carriers that arise during the avalanche or be adversely influenced in terms of the electrical effect by incorporation of charge carriers. Furthermore, this breakdown location A2 is homogeneously distributed along the gate trench 30, so that charge carriers can also arise at the level of the source zone S and thus form a highly unfavorable current path toward the body contact. As a consequence thereof, a parasitic bipolar transistor situated below the source electrode may trigger and destroy the component. In principle, the static breakdown voltage at the location A2 of the field plate step is also lowered by approximately 25% of the nominal component breakdown voltage relative to the breakdown location A1 at the trench bottom, which may in turn lead to an unfavorable breakdown behavior.

Figure 5A:
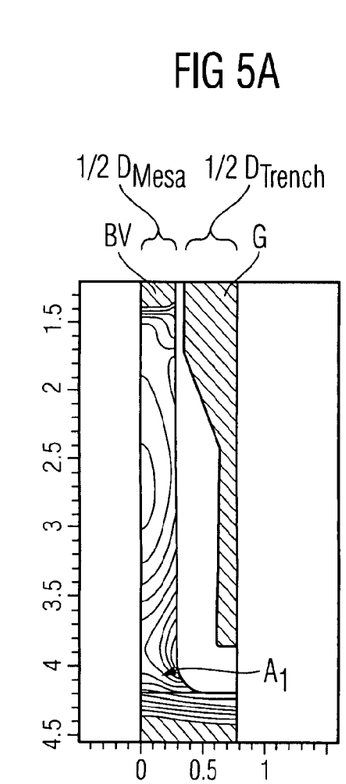
FIGS. 5A-5D graphically illustrate simulations of the electric field distributions of a known MOS transistor device, for instance in accordance with FIG. 2, at avalanche with a current density that increases from left to right.
Figure 5B:
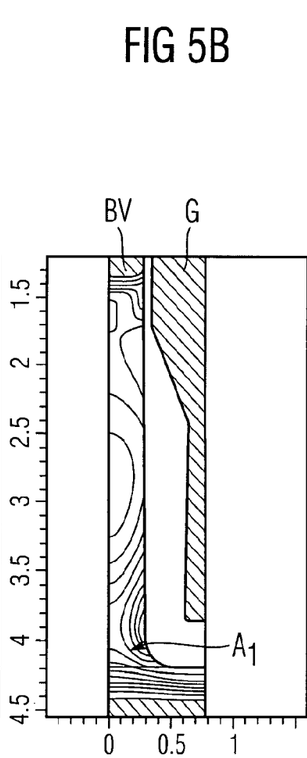
Figure 5C:
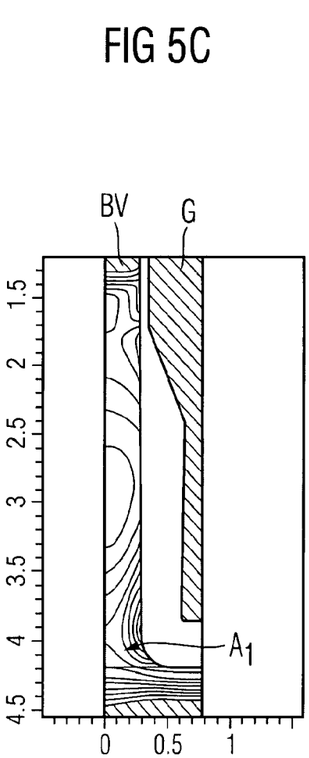
Figure 5D:
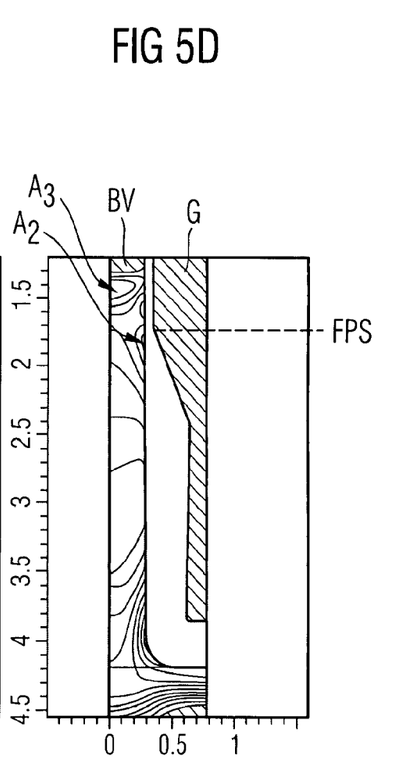

This jumping-up of the breakdown location in the high-current case will be explained below with reference to FIGS. 5A, B, C and D, which graphically illustrate simulation results for the avalanche case. It should be noted that FIGS. 5A-D, on account of the mirror symmetry in the lateral direction X, in each case show the electric field distribution (through field lines) only for half the mesa width ½ $D_{Mesa}$ and half the trench width ½ $D_{Trench}$. During the simulation, the current density was increased from left to right, i.e., from FIG. 5A to FIG. 5D, FIG. 5D illustrating the high-current case. It can clearly be seen that, in the avalanche cases A, B, C the location A1 of the probable breakdown lies in the bottom region of the gate trench, while the high-current case of FIG. 5D exhibits two further locations A2 and A3 having increased field strength which indicate a probable breakdown location. The location A2 lies beside the field plate step FPS and the location A3 lies at the bottom of the customary body reinforcement BV (cf. FIG. 2).

In planar transistor concepts, in order to achieve good avalanche strength, additional body reinforcement implantations have hitherto been added directly below the body contacts in order, on the one hand, to fix the avalanche breakdown location there and, on the other hand, to be able to optimally extract the charge carriers generated. In trench transistor concepts such as in the case of the concept described in the introduction, either a trench contact with a body reinforcement zone or directly one or a plurality of body reinforcement zones have been introduced in the cell center between two gate trenches in order likewise to fix the breakdown location there and to be able to optimally extract the charge carriers generated. These solutions function very well with regard to the avalanche strength but require a great deal of space in order not to influence the channel region and thus increase the threshold voltage by virtue of the body reinforcement.

SUMMARY

The present invention provides a transistor device. In one embodiment, the transistor device includes a gate trench having a gate step. A mesa region is located adjacent the gate trench. The mesa region includes a body reinforcement extending at least as deep as the gate step.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of the invention enable a generic MOS transistor device in the dense trench regime in such a way as to achieve a highest possible avalanche strength in conjunction with a low on resistivity.

In accordance with one embodiment, a MOS transistor device of the trench type, in which, in a semiconductor region of a first conductivity type, within a deep gate trench extending in the vertical direction of the semiconductor region, a vertical gate electrode and a gate oxide insulating the latter are formed. In an adjoining mesa region outside and laterally with respect to the gate trench, at the upper section thereof, a source electrode region of the first conductivity type and a body region of a second conductivity type with one or a plurality of assigned body contact(s) are formed. The gate oxide is thinned in the upper section and undergoing transition via a field plate step to a thickened section situated in the lower section of the gate trench. A drain electrode region of the first conductivity type lies opposite the gate trench in the vertical direction. The MOS transistor device comprising a multiplicity of vertical MOS transistors, a gate trench and a mesa region always being formed successively in a manner alternating in the lateral direction, which is perpendicular to the vertical direction. Each mesa region being a dense mesa region which, in particular with respect to an adjacent MOS transistor, has a width that is less than 2.5 times the maximum thickness of the gate oxide in the associated gate trench, is characterized by the fact that the MOS transistor device furthermore has a deep body reinforcement of the second conductivity type, which is provided below the body region at the location of the body contact and reaches into the depth of the semiconductor region at least as far as the field plate step of the gate oxide or deeper.

In one embodiment, the invention provides introducing a body reinforcement that reaches deeper than the field plate step, "traps" the jumping breakdown location coming from the trench bottom and thus "shields" the jump to the field plate step. The deep body reinforcement is intended to be embodied only in the zones directly below the body contact connection in order that the charge carriers generated in the high-current case at the deep body reinforcement can be optimally extracted to the body contact. Through the downwardly exposed geometrical position of the deep body reinforcement, it is furthermore possible for charge carriers that are still generated at the bottom of the gate trench below source zones also to be extracted laterally without these charge carriers having to flow away through the body zone pinched off at high impedance. In the case of the novel structure with the deep body reinforcement, it happens that the pn junction that forms between the epitaxial layer and, depending on the location, along the mesa, the body, the body reinforcement and the deep body reinforcement oscillates about the field plate base point (in the body region it lies above the base point and in the deep body reinforcement region it lies significantly below the base point).

It is advantageous that a first breakdown location forms at the bottom region of the gate trench in the avalanche case and a second breakdown location forms at the bottom of the deep body reinforcement for the high-current case. In the case of the MOS transistor device according to the invention, the first conductivity type may be the n type and the second conductivity type may be the p type. In one embodiment, this MOS transistor device advantageously and preferably forms a DMOS power transistor.

Furthermore, in one embodiment of the MOS transistor device according to the invention, the deep body reinforcement may be formed by a plurality of staggered implantation zones. As an alternative embodiment to this, the deep body reinforcement may be formed in a body reinforcement trench introduced into the semiconductor region in the so-called body contact trench for example in combination with one or a plurality of deep body reinforcement implantations. One feature of the invention, in all these variants, is that the deepest implantations lie at least directly at or deeper than the field plate step. The lateral spacings (in the y direction) of this deep body reinforcement structure can be made longer or shorter depending on the threshold voltage class.

One advantage of the deep body reinforcement proposed in the case of the MOS transistor device according to the invention is that the avalanche strength is improved by the jumping breakdown location at the bottom of the deep body reinforcement while a low on resistivity can at the same time be complied with.

Figure 1:
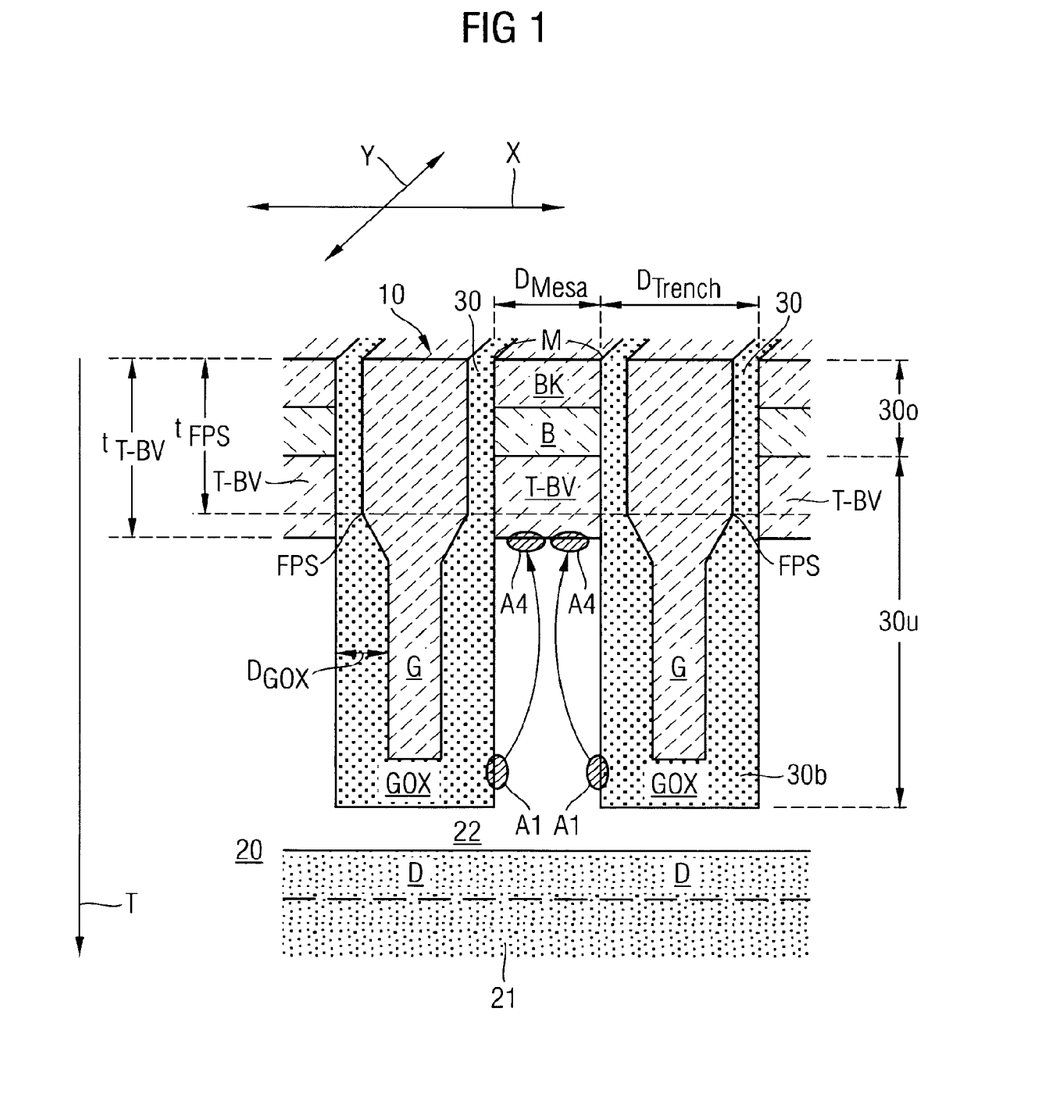
FIG. 1 schematically illustrates a lateral cross-sectional view of a MOS transistor device, showing a section with two parallel dense trench MOS transistors next to one another.

FIG. 1 illustrates a dense trench MOS transistor device in a lateral cross-sectional illustration similarly to FIG. 2 already discussed in the introduction, in the case of which transistor device, according to the invention, in the mesa M lying between the gate trenches 30, below a body zone B, a deep body reinforcement T-BV is formed at the location of the body contact. The depth of the body reinforcement, i.e., its bottom, is specified by $t_{T-BV}$ in FIG. 1. It is clear that this depth $t_{T-BV}$ of the deep body reinforcement T-BV in the direction T is deeper than the field plate step FPS, the depth of which is specified by $t_{FPS}$. In the dense trench regime in which the mesa region lying between two adjacent gate trenches 30 has a width $D_{Mesa}$ that is less than 2.5 times the maximum thickness $D_{GOX}$ of the gate oxide, the static breakdown normally takes place at the trench bottom (locations A1). If the current density in the avalanche case reaches such high values that the background doping of the epitaxial layers in the mesa M is appreciably influenced (high high-current case), the electric field distribution changes in such a way that the breakdown location in the mesa jumps further upward. The deep body reinforcement T-BV according to the invention, which passes below the field plate step FPS in the depth direction T, "traps" the jumping breakdown location coming from the trench bottom 30b (locations A1) in the high-current case. Accordingly, breakdown locations A4 are formed at the bottom of the deep body reinforcement T-BV, thereby avoiding the disadvantageous jump to the field plate step FPS.

It can be seen in FIG. 1 that the deep body reinforcement T-BV in accordance with the preferred exemplary embodiment is embodied only in the zones directly below the body contact connection in order that the charge carriers generated at the deep body reinforcement T-BV in the high-current case can be optimally extracted to the body contact. By virtue of the downwardly exposed geometrical position of the deep body reinforcement T-BV of a dense trench MOS transistor according to the invention it is furthermore possible for charge carriers that are still generated at the trench bottom below source zones also to be laterally extracted without these charge carriers having to flow away through the high-impedance pinched-off body zone. This will be explained in greater detail with reference to FIG. 8. It should be mentioned, moreover, that the dense trench MOS transistor structure according to one embodiment of the invention as illustrated in FIG. 1 continues in the lateral direction specified by an arrow Y, and that the other features of the dense trench MOS transistor structure illustrated in FIG. 1 correspond to features of FIG. 2 and are provided with the same reference symbols.

Figure 3:
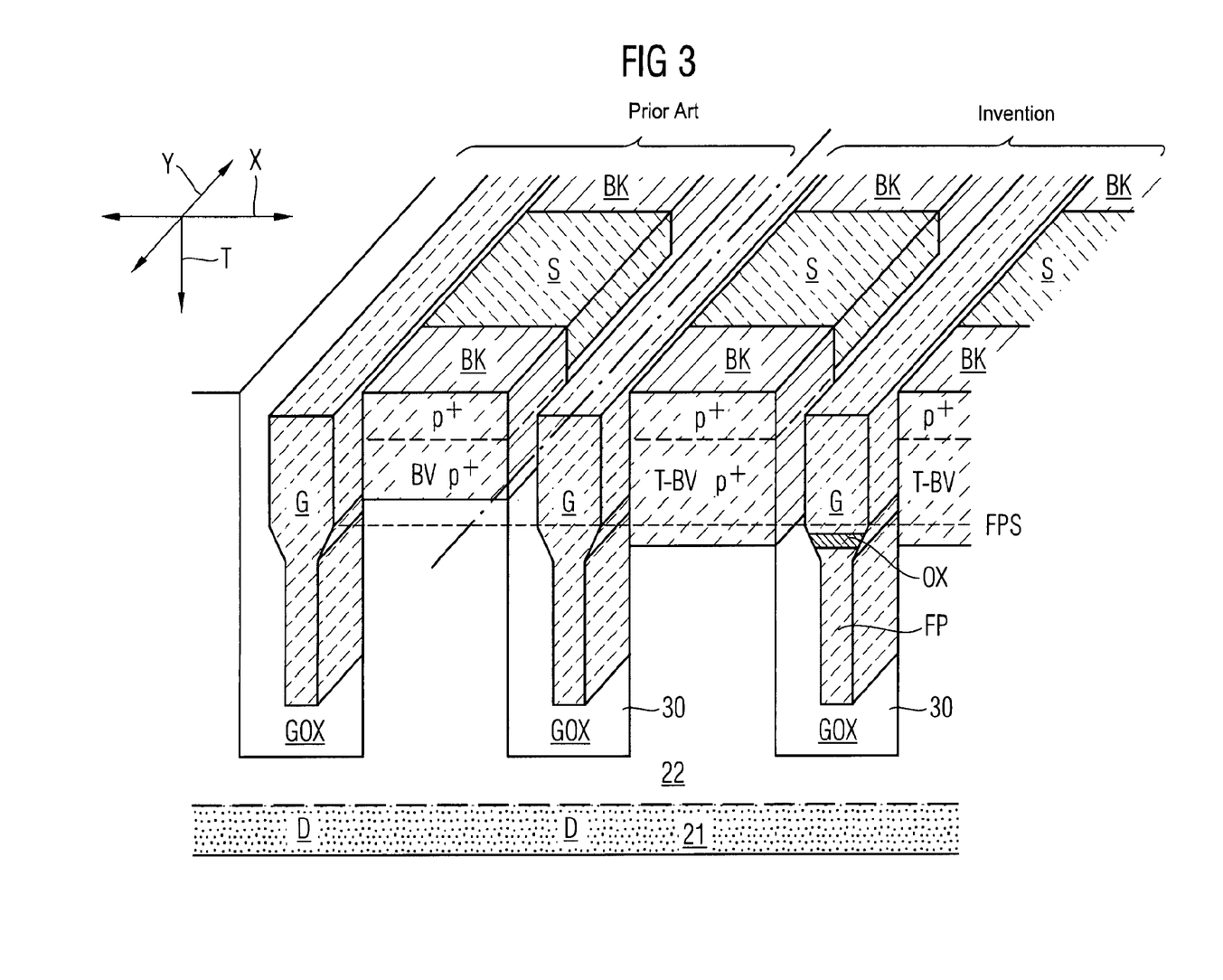
FIG. 3 illustrates a perspective sectional view showing a comparison of a MOS transistor device of the prior art for instance in accordance with FIG. 2 with a MOS transistor device according to the invention for instance in accordance with FIG. 1.

In order to illustrate the dense trench MOS transistor structure continuing in the lateral direction Y, FIG. 3 illustrates a perspective sectional view with a sectional plane through the body contacts BK, to be precise in its left-hand half the structure of a dense trench MOS transistor corresponding to the prior art and in the right-hand half the structure of a dense trench MOS transistor according to the invention with a deep body reinforcement T-BV that is formed only below the body contact BK. The body zone B (not shown in FIG. 3) itself also extends below the source electrode S. The right-hand side of FIG. 3 also shows a variant of the dense trench MOS transistor according to the invention in which a plurality of electrode regions are formed in the gate trench 30, to be precise a gate region G in the upper region and a field plate electrode FP in the lower region, which are isolated from one another by an oxide layer OX at an expedient depth. Furthermore, there may also be more than two gate electrode regions situated in the deep gate trench 30.

Figure 4:
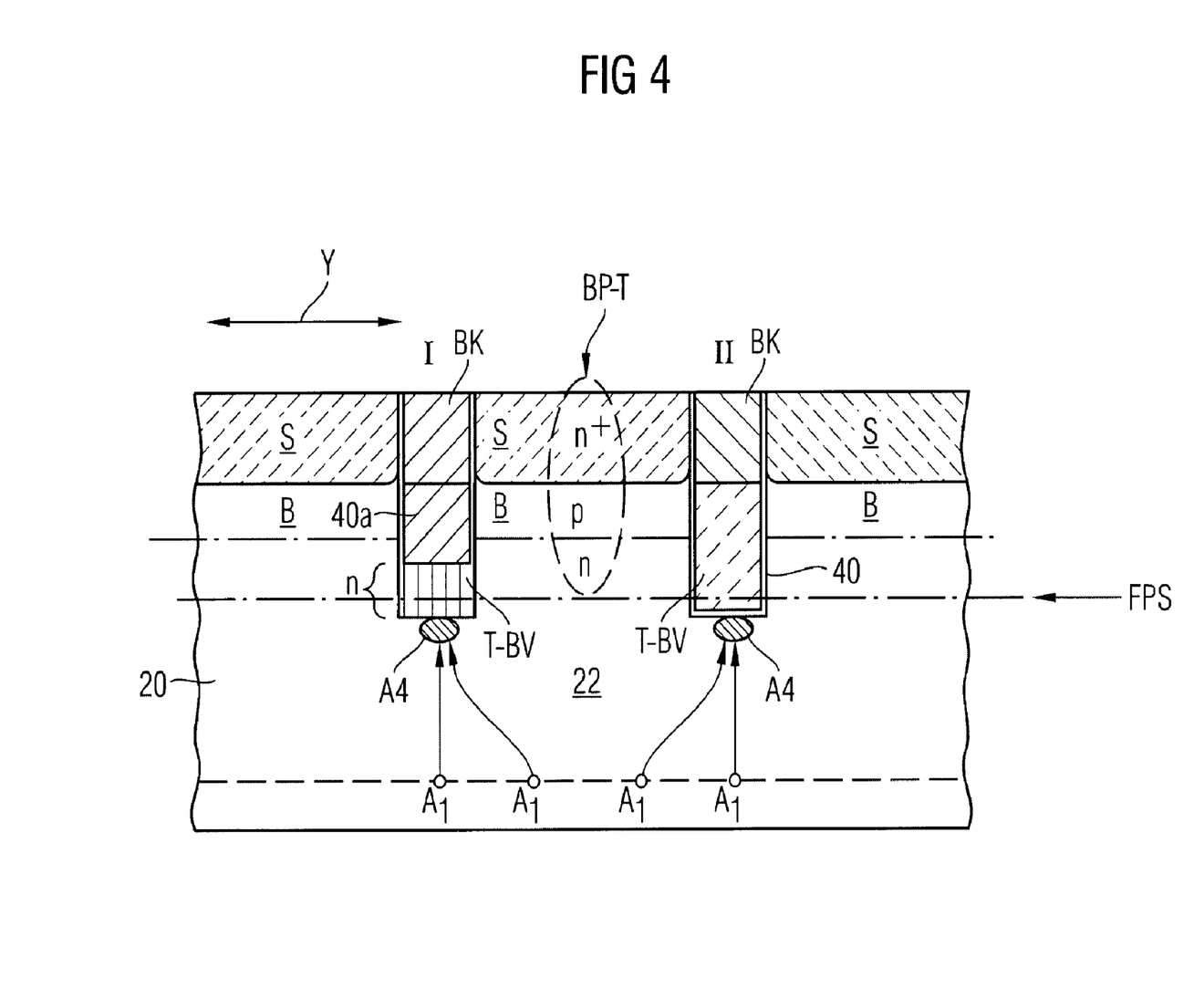
FIG. 4 illustrates a schematic lateral cross-sectional view in the direction of the arrow Y of FIG. 1, which compares two alternative exemplary embodiments of a MOS transistor device according to the invention.

FIG. 4 illustrates, by means of a section through the mesa center in the lateral direction illustrated by the arrow Y, further variants of a dense trench MOS transistor according to the invention, to be precise in the left-hand part I a variant with a plurality of staggered implantation zones n (up to six implantations were realized here) which corresponds to the exemplary embodiment illustrated in FIG. 1, and in the right hand part II a variant in which the deep body reinforcement T-BV is formed by a deep body reinforcement trench 40. Mixed forms with body contact trenches 40a that are somewhat less deep and supplementary with one or a plurality of implantations n are also possible. The body reinforcement trenches 40 or body contact trenches 40a may be filled with highly doped $p^+$-type polysilicon. An essential feature of both variants I and II of the dense trench MOS transistor according to the invention is once again that the deepest implantations and/or the deepest point of the body reinforcement trench 40 lie at least directly at or deeper than the field plate step (indicated by an arrow FPS). The lateral spacings (in the direction of the arrow Y) of these deep body reinforcement structures can be made longer or shorter depending on the threshold voltage class. It is advantageous that the breakdown locations A1 along the trench bottom can jump to the deep body reinforcement not only perpendicularly upward but also laterally from a location below the source zone to a location below the body zone.

FIG. 4 indicates by dashed lines a parasitic bipolar transistor BP-T that arises as a result of the $n^+$-p-n doping of respectively the source electrode S, the body zone B and the epitaxial layer 22 in the mesa.

Furthermore, reference is made to the graphical representation of FIGS. 6A-6D, which illustrates the simulation results of the electric field distribution at avalanche for a MOS transistor device according to the invention.

Figure 6A:
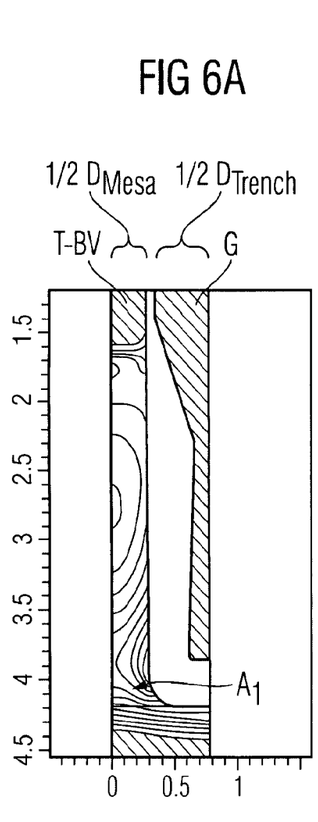
FIGS. 6A-D graphically illustrate simulations of the electric field distribution which hold true for a MOS transistor device according to the invention with a deep body reinforcement.
Figure 6B:
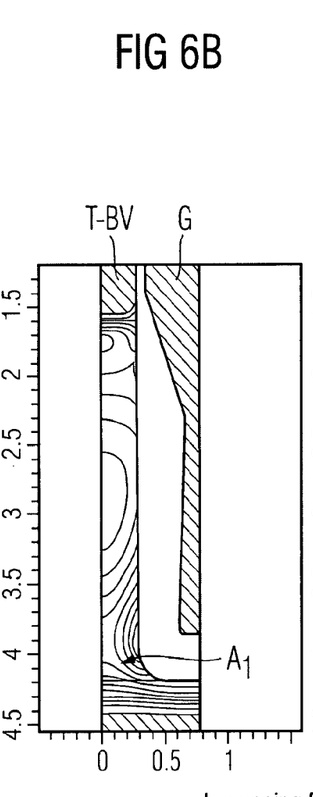
Figure 6C:
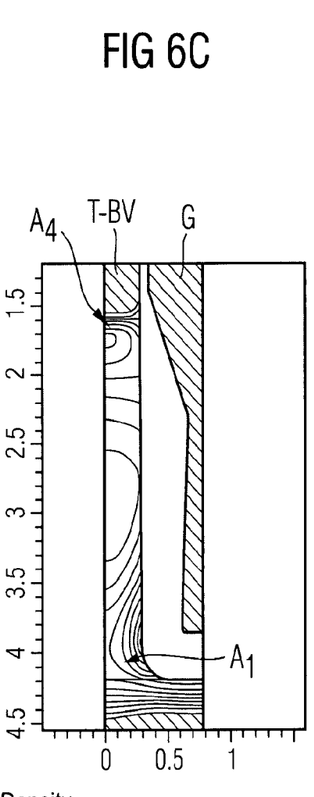
Figure 6D:
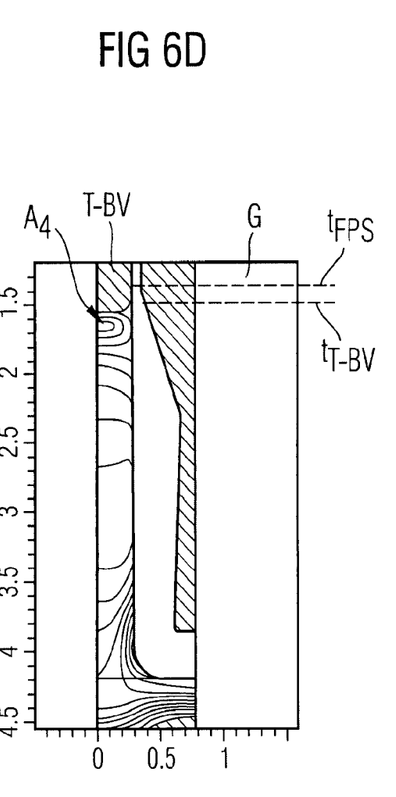

The simulations of the electric field distributions of a dense trench MOS transistor according to the invention which are illustrated in FIG. 6 take as a basis for parts A-D a current density that increases from left to right, that is to say that FIG. 6D illustrates the high-current case at avalanche. FIG. 6D illustrates that, in the high-current case, the probable location—designated by A1—of the avalanche breakdown (FIGS. 6A-C) jumps upward under the bottom of the deep body reinforcement T-BV (breakdown location A4), the bottom of which in the depth direction lies at the same depth or deeper than the field plate step FPS ($t_{FPS} \leq t_{T-BV}$). FIGS. 6A-6D show the case $t_{FPS} < t_{T-BV}$. This location A4 at the bottom of the deep body reinforcement T-BV is optimal for the extraction of the charge carriers since it also lies directly below the body contact (cf. FIG. 4).

By virtue of the fact that, by virtue of the dense trench MOS transistor structure according to the invention, in the high-current case during avalanche, the probable breakdown location A4 that has jumped upward lies at the bottom of the deep reinforcement T-BV (cf. FIG. 6D), it is possible to avoid the situation where the parasitic bipolar transistor BP-T explained above and indicated in FIG. 4 triggers and destroys the component.

Figure 7A:
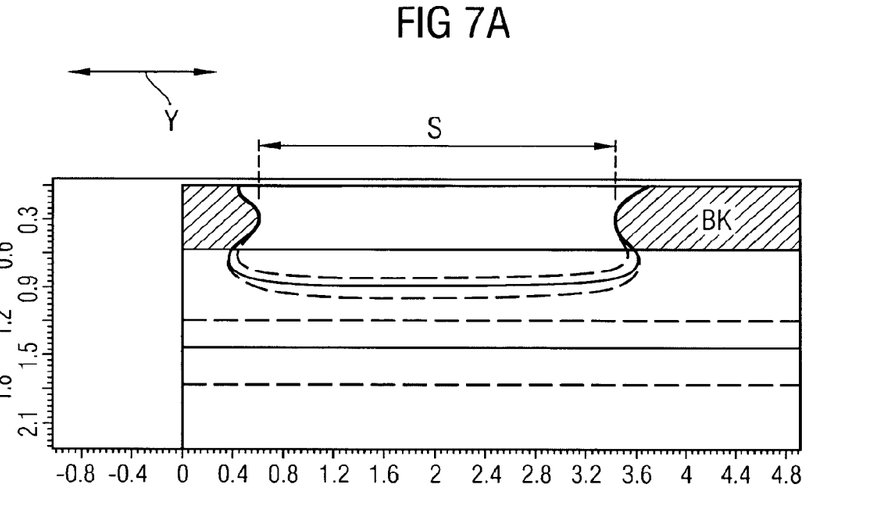
FIGS. 7A-7B illustrate schematic sectional illustrations along the mesa center in the lateral direction illustrated by the arrow Y in FIGS. 1 and 2, which illustrate the pn junctions using solid lines and the boundaries of the space charge zones using dashed lines, to be precise in FIG. 7A for a known MOS transistor device entirely without body reinforcement and in FIG. 7B for a MOS transistor device according to the invention with a deep body reinforcement.
Figure 7B:
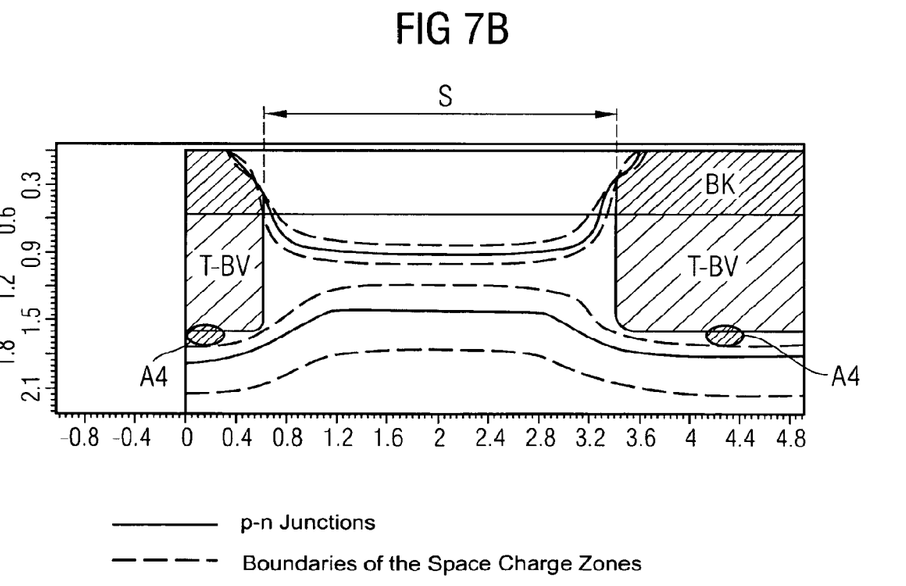

FIG. 7 illustrates, in the form of sectional views along the mesa center in the lateral direction indicated by the arrow Y, the pn junctions by means of solid lines and the boundaries of the space charge zones using dashed lines, to be precise in FIG. 7A for a customary dense trench MOS transistor completely without body reinforcement and in FIG. 7B for a dense trench MOS transistor according to the invention with a deep body reinforcement T-BV below the body contact.

Figure 8A:
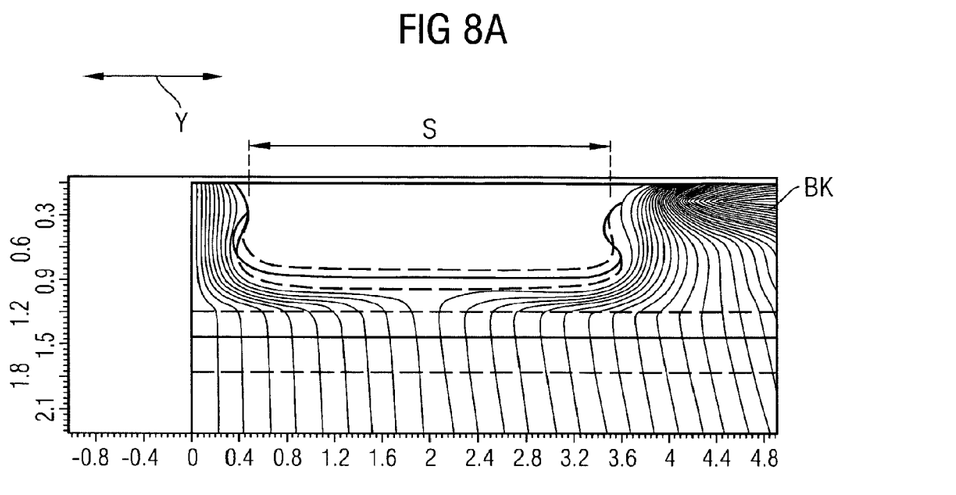
FIGS. 8A-8B likewise illustrate sectional illustrations along the mesa center similarly to FIGS. 7A-7B, illustrating through black current lines the possible current paths of the charge carriers generated in the avalanche case (hole current here), to be precise in FIG. 8A for a known MOS transistor device entirely without body reinforcement and in FIG. 8B for a MOS transistor device according to the invention with a deep body reinforcement for instance in accordance with FIG. 1.
Figure 8B:
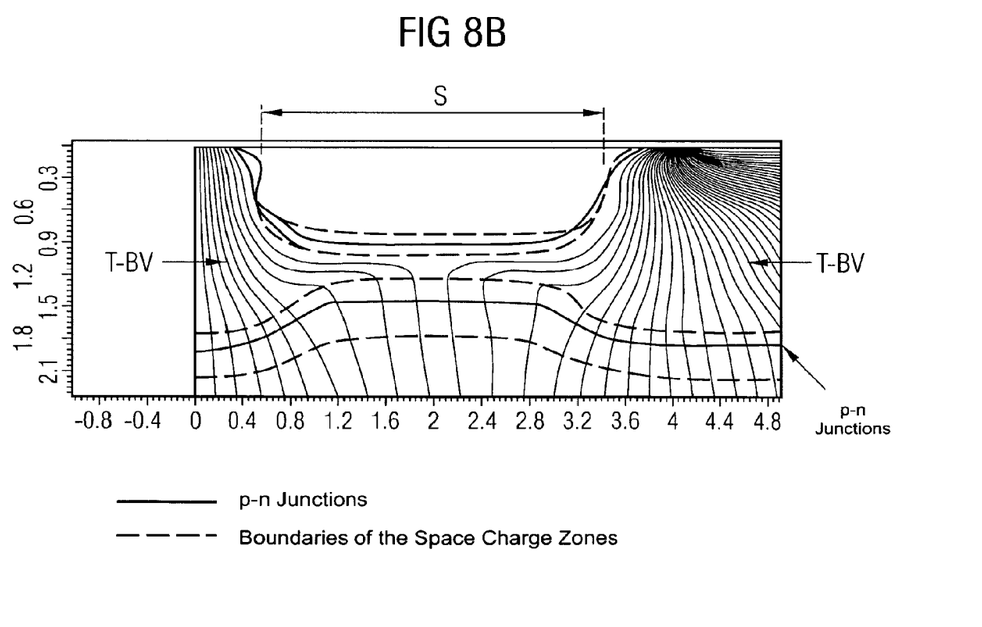

FIG. 8 essentially reproduces the same sectional views as FIG. 7, i.e., FIG. 8A for a customary dense trench MOS transistor without any body reinforcement and FIG. 8B for a dense trench MOS transistor according to the invention with a deep body reinforcement T-BV. FIGS. 8A and 8B additionally depict the possible current paths of the charge carriers generated in the avalanche case (the hole current here) in the form of flow lines. In the case of the deep body reinforcement T-BV, much fewer holes flow along directly below the source zone S, which reduces the voltage drop across the parasitic bipolar transistor BP-T indicated in FIG. 4 and thus significantly improves the avalanche strength. In the body region, the transverse resistance in the body zone is intended to have the lowest possible value, so that the critical voltage drop of typically 0.5 V that triggers the bipolar transistor cannot arise at all. The deep body reinforcement T-BV, as made clear by FIG. 8B, acts as it were as a charge extractor that already laterally extracts the holes at a greater depth and then optimally forwards them to the body contact located above (not illustrated in FIG. 8).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A trench transistor device having an upper semiconductor region and a lower semiconductor region, comprising:
    a substrate layer provided in the lower semiconductor region;
    at least a first and a second gate trench, each extending in a vertical direction through the upper semiconductor region and the lower semiconductor region toward but not into the substrate layer, and having a length defined in a first lateral direction and a thickness defined in a second lateral direction of the semiconductor regions, the first lateral direction crossing the second lateral direction;
    a gate electrode projecting in the vertical direction into the gate trench, insulated via an outer gate oxide, the gate electrode having a gate step beginning at a transition from the upper semiconductor region to the lower semiconductor region defining a field plate in the upper semiconductor region where the gate oxide in the second lateral direction is thinner than in the lower semiconductor region; and
    a dense trench mesa region formed in the upper semiconductor region in parallel with and between the first and second gate trenches, said dense trench mesa region having a length extending in the first lateral direction and a width in the second lateral direction between the first and second gate trenches which is less than 2.5 times a maximum thickness of the gate oxide in the gate trenches, said dense trench mesa region comprising the following semiconductor regions:
    a source electrode, a body region extending below the source electrode, and a body contact region extending above the body region but not to a depth of the gate step;
    a body reinforcement positioned below the body region only at the location of the body contact region and extending in vertical direction through a portion of the upper region to a depth below the gate step but not extending to the substrate layer; and
    said source electrode and said body contact region being alternately provided at the top most section of the mesa region in the first lateral direction and widths of said source electrode, said body region, said body contact region and said body reinforcement defined in the second lateral direction being equal to the width of the mesa region.

2. The device of claim 1, wherein the device is formed in a semiconductor region, a substrate region and an epitaxial region.

3. The device of claim 2, comprising a drain electrode opposite the gate trench, in the substrate region.

4. The device of claim 1, wherein the gate oxide is much thicker in the lower region relative to the upper region.

5. The device of claim 1, wherein the gate oxide is a silicon oxide.

6. The device of claim 1, wherein the gate electrode is thinner in the lower region relative to the upper region via the gate step.

7. The device of claim 1, wherein the source electrode is of a first conductivity type, and the body reinforcement is of a second conductivity type.

8. A MOS trench transistor device comprising:
    a semiconductor region of a first conductivity type;
    a vertical gate electrode;
    a gate oxide insulating the vertical gate electrode, the vertical gate electrode formed within a deep vertical gate trench within the semiconductor region and having a length defined in a first lateral direction and a thickness defined in a second lateral direction of the semiconductor region, the first lateral direction crossing the second lateral direction;
    a source electrode region of the first conductivity type at the upper section of a mesa region provided within the semiconductor region outside the gate trench and laterally and in parallel adjoining the gate trench, said mesa region having a length and a width, wherein the length of the mesa region extends in the first lateral direction and its width extends in the second lateral direction and said mesa region comprises:
    below the source electrode region a semiconductor body region of a second conductivity type with one or a plurality of assigned semiconductor body contact regions, formed at the upper section of the mesa region;
    the gate oxide being thinner in the upper section and undergoing a transition via a field plate step so as to be thicker in the lower section of the gate trench; and a drain electrode region of the first conductivity type lying opposite the gate trench in the vertical direction; and the MOS transistor device comprising a multiplicity of vertical MOS transistors, a gate trench and a mesa region alternating in the second lateral direction;

each mesa region being a dense trench mesa region which has with respect to an adjacent MOS transistor a width in the second lateral direction that is less than 2.5 times the maximum thickness of the gate oxide in the associated gate trench and in which plural source electrode regions and each body contact regions are successively and alternately provided in the length direction of the mesa region;

wherein the MOS transistor device furthermore has a deep body reinforcement of the second conductivity type which is provided below the semiconductor body region only at the locations of the body contact region and reaches into the depth of the semiconductor region below a field plate step of the gate oxide but not into a substrate region.

9. The MOS transistor device of claim 8, wherein the deep body reinforcement is formed by one or a plurality of staggered implantation.

10. The MOS transistor device of claim 8, wherein the deep body reinforcement is formed in a deep body reinforcement trench introduced into the semiconductor region.

11. The MOS transistor device of claim 8, wherein the deep body reinforcement is formed by a body reinforcement trench and by one or a plurality of adjoining implantations in the body reinforcement trench.

12. The MOS transistor device of claim 8, wherein the device forms a DMOS power transistor.

13. A MOS trench transistor device comprising:
a semiconductor region of a first conductivity type;
a vertical gate electrode;
a gate oxide insulating the vertical gate electrode formed within a deep vertical gate trench extending within the semiconductor region and having a length defined in a first lateral direction and a thickness defined in a second lateral direction of the semiconductor region, the first lateral direction crossing the second lateral direction;
a source electrode region of the first conductivity type in an upper section of a mesa region provided within the semiconductor region outside of the gate trench and laterally and in parallel adjoining the gate trench, said mesa region having a length and a width, wherein the length of the mesa region extends in the first lateral direction and its width extends in the second lateral direction and the mesa region comprises;

below the source region a semiconductor body region of a second conductivity type with one or a plurality of assigned semiconductor body contact region formed at the upper section of the mesa region;

the gate oxide being thinned in the upper section of the gate trench and undergoing transition via a field plate step to a second section situated in the lower section of the gate trench, and a drain electrode region of the first conductivity type lying opposite the gate trench in the vertical direction, and the MOS transistor device comprising a multiplicity of vertical MOS transistors, a gate trench and a mesa region always being formed successively in a manner alternating in the second lateral direction, and each mesa region being a dense trench mesa region which has with respect to an adjacent MOS transistor a width in the second lateral direction that is less than 2.5 times the maximum thickness of the gate oxide in the associated gate trench and in which plural source electrode regions and each semiconductor body contact regions are successively and alternately provided in the length direction of the mesa region; and wherein the MOS transistor device furthermore has a deep body reinforcement of the second conductivity type which is provided below the semiconductor body region only at the locations of the body contact regions and reaches into the depth of the semiconductor region below a field plate step but not to a substrate region.

14. The MOS transistor device of claim 13, wherein the deep body reinforcement is formed in a deep body reinforcement trench introduced into the semiconductor region.

15. The MOS transistor device of claim 14, wherein the deep body reinforcement is formed by a body reinforcement trench and one or a plurality of adjoining implantations in the body reinforcement trench.

16. The MOS transistor device of claim 13, wherein the device forms a DMOS power transistor.

\* \* \* \* \*